(12) United States Patent
Amagai et al.

(10) Patent No.: US 10,876,983 B2
(45) Date of Patent: Dec. 29, 2020

(54) THERMOPHYSICAL PROPERTY MEASUREMENT METHOD AND THERMOPHYSICAL PROPERTY MEASUREMENT APPARATUS

(71) Applicant: NATIONAL INSTITUTE OF ADVANCED INDUSTRIAL SCIENCE AND TECHNOLOGY, Tokyo (JP)

(72) Inventors: Yasutaka Amagai, Tsukuba (JP); Takeshi Shimazaki, Tsukuba (JP); Hiroyuki Fujiki, Tsukuba (JP)

(73) Assignee: NATIONAL INSTITUTE OF ADVANCED INDUSTRIAL SCIENCE AND TECHNOLOGY

(*) Notice: Subject to any disclaimer, the term of this patent is extended or adjusted under 35 U.S.C. 154(b) by 195 days.

(21) Appl. No.: 16/086,691

(22) PCT Filed: Feb. 28, 2017

(86) PCT No.: PCT/JP2017/007792
§ 371 (c)(1),
(2) Date: Sep. 20, 2018

(87) PCT Pub. No.: WO2017/169462
PCT Pub. Date: Oct. 5, 2017

(65) Prior Publication Data
US 2019/0086346 A1    Mar. 21, 2019

(30) Foreign Application Priority Data
Mar. 29, 2016   (JP) .................. 2016-065284

(51) Int. Cl.
*G01N 25/18*   (2006.01)
*G01K 7/00*   (2006.01)
(Continued)

(52) U.S. Cl.
CPC ............. *G01N 25/18* (2013.01); *G01R 21/02* (2013.01)

(58) Field of Classification Search
USPC .................. 374/44, 179, 208, 10, 112, 166
See application file for complete search history.

(56) References Cited

U.S. PATENT DOCUMENTS

2016/0202196 A1* 7/2016 Amagai .................. G01K 7/02
374/44

FOREIGN PATENT DOCUMENTS

WO   WO 2015/025586 A1   2/2015

OTHER PUBLICATIONS

International Search Report dated May 30, 2017 in corresponding PCT International Application No. PCT/JP2017/007792.
(Continued)

*Primary Examiner* — Mirellys Jagan
(74) *Attorney, Agent, or Firm* — Ostrolenk Faber LLP

(57) ABSTRACT

Thermophysical property measurement method and apparatus are provided that make it possible to simply and conveniently obtain a highly precise absolute thermoelectric power and thermal conductivity.
Embodiments of the present invention provides a thermophysical property measurement method, including a first step of applying a DC voltage or a DC current at both ends of a metal to which a temperature gradient is applied to measure a first temperature at a center of the metal; a second step of applying DC voltages or DC currents of different polarities at both ends of the metal to measure a second temperature at the center of the metal; a third step of calculating a Thomson coefficient of the metal using the first and second temperatures measured in the first and second steps; and a fourth step of calculating at least one of absolute thermoelectric power and thermal conductivity of the metal using the Thomson coefficient calculated in the third step, the third step including: calculating an average value of a difference between the first temperature and the second
(Continued)

temperature; calculating an average value of a sum of the first temperature and the second temperature; and dividing a product of a magnitude of a current that flows through the metal, electrical resistance of the metal, and the average value of the difference by the average value of the sum and the difference between the first temperature and the second temperature.

5 Claims, 2 Drawing Sheets

(51) Int. Cl.
  G01K 1/00   (2006.01)
  G01K 3/00   (2006.01)
  G01R 21/02  (2006.01)

(56) References Cited

OTHER PUBLICATIONS

Written Opinion dated May 30, 2017 in corresponding PCT International Application No. PCT/JP2017/007792.
Y. Amagai et al., "AC/DC Transfer Technique for Measuring Thomson Coefficient: Toward Thermoelectric Metrology," IEEE Transactions on Instrumentation and Measurement, Jun. 2015, vol. 64, No. 6, pp. 1576-1581.
R.B. Roberts, "The absolute scale of thermoelectricity," Philosophical Magazine, 1977, vol. 36, No. 1, pp. 91-107.

* cited by examiner

THERMOPHYSICAL PROPERTY MEASUREMENT METHOD AND THERMOPHYSICAL PROPERTY MEASUREMENT APPARATUS

CROSS-REFERENCE TO RELATED APPLICATIONS

The present application is a 35 U.S.C. §§ 371 national phase conversion of PCT/JP2017/007792, filed Feb. 28, 2017, which claims priority to Japanese Patent Application No. 2016-065284, filed Mar. 29, 2016, the contents of which are incorporated herein by reference. The PCT International Application was published in the Japanese language.

TECHNICAL FIELD

The present invention relates to methods and apparatuses for measuring thermophysical property values.

BACKGROUND ART

Establishing highly reliable thermoelectric power measurement techniques is an important issue as they become indicators of conversion efficiency of thermoelectric conversion power generation devices that are expected as unutilized thermal power generation. Generally, thermoelectric power is to be measured as a value relative to platinum; it is a physical quantity whose material unit physical property measurement is uniquely difficult of parameters required for efficiency estimation of a thermoelectric power generation module and optimal thermal design. Therefore, attempts have been made to precisely determine the absolute thermoelectric power of material units to be references, such as platinum, lead, and copper, by measuring the Thomson heat.

Here, with the existing Thomson coefficient calculating method, accurate values are required for the thermal conductivity and dimensions of a sample and the heat loss coefficient from the thermocouple. However, since it is difficult to accurately measure these physical quantities, the applicant for the present application proposed a method of measuring absolute thermoelectric power using AC power supplies in Patent Document 1.

CITATION LIST

Patent Document

[Patent Document 1] WO2015025586A

DISCLOSURE OF THE INVENTION

Problems to be Solved by the Invention

However, to carry out a measurement technique disclosed in Patent Document 1, there is a problem that it is necessary to control a measurement apparatus provided with an AC power supply as well as a DC power supply and a switch for selectively connecting the AC power supply and the DC power supply to what is measured and that the measurement apparatus and the measurement technique become complex. Moreover, in conjunction with the use of the AC power supply, there is a problem that a need arises to take into account electromagnetic radiation to the measurement space in accordance with AC frequency and heat loss due to inductance and stray capacitance of the sample to be measured. Moreover, there is also a problem that, as the cutoff frequency at which heat dissipation and heat absorption due to the Thomson effect become sufficiently small depends on the geometrical shape and physical properties of the sample, the material and shape of what is to be measured become restricted.

In view of solving the problems as described above, an object of embodiments of the present invention is to provide a thermophysical property measurement method and a thermophysical property measurement apparatus that make it possible to simply and conveniently obtain highly precise absolute thermoelectric power and thermal conductivity.

Means for Solving the Problems

To solve the above-described problems, an embodiment of the present invention provides a thermophysical property measurement method, including a first step of applying a DC voltage or a DC current at both ends of a metal to which a temperature gradient is applied to measure a first temperature at a center of the metal; a second step of applying DC voltages or DC currents of different polarities at both ends of the metal to measure a second temperature at the center of the metal; a third step of calculating a Thomson coefficient of the metal using the first and second temperatures measured in the first and second steps; and a fourth step of calculating at least one of absolute thermoelectric power and thermal conductivity of the metal using the Thomson coefficient calculated in the third step, the third step including: calculating an average value of a difference between the first temperature and the second temperature; calculating an average value of a sum of the first temperature and the second temperature; and dividing a product of a magnitude of a current that flows through the metal, electrical resistance of the metal, and the average value of the difference by the average value of the sum and the difference between the first temperature and the second temperature.

Moreover, to solve the above-described problem, an embodiment of the present invention provides a thermophysical property measurement apparatus, including a voltage application unit that applies a DC voltage at both ends of a metal to which a temperature gradient is applied; a temperature measurement unit that measures a first temperature at a center of the metal when the DC voltage is applied by the voltage application unit and measures a second temperature at the center of the metal when DC voltages of different polarities are applied by the voltage application unit; and a thermophysical property calculation unit that calculates an average value of a sum of the first temperature and the second temperature and a difference between the first temperature and the second temperature that are measured by the temperature measurement unit to calculate a Thomson coefficient of the metal by dividing a product of a magnitude of a current that flows thorough the metal, electrical resistance of the metal, and the average value of the difference by the average value of the sum and the difference of the first temperature and the second temperature and calculate at least one of absolute thermoelectric power and thermal conductivity of the metal using the Thomson coefficient.

Effects of the Invention

Embodiments of the present invention make it possible to simply and conveniently obtain highly precise absolute thermoelectric power and thermal conductivity.

MODE FOR CARRYING OUT THE INVENTION

Figure 1:
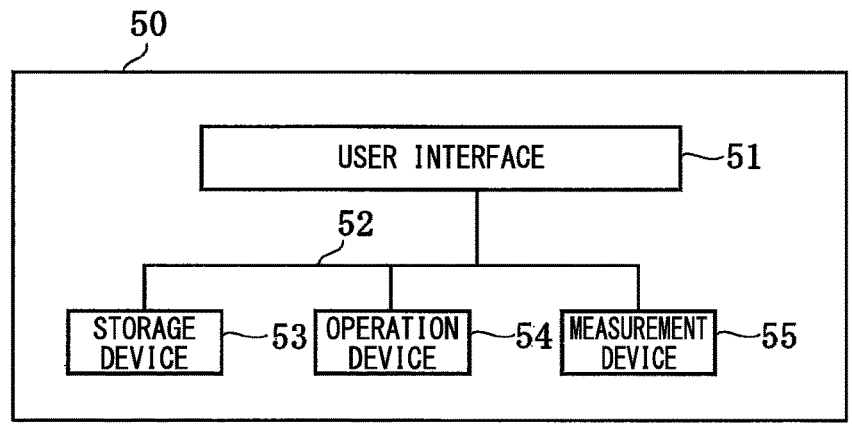
FIG. 1 is a block diagram illustrating the configuration of a thermophysical property measurement device 50 according to an embodiment of the present invention.

Below details of embodiments of the present invention are explained with reference to the drawings. In the figures, the same letters indicate identical or corresponding parts.

The absolute value of thermoelectric power of a metal material such as lead, copper, and platinum is a physical property value which is indispensable for a relative measurement method of thermoelectric power that is widely used in the field of physical property measurement. Absolute thermoelectric power uses the state in which the thermoelectric power of the metal material reaches zero and is derived by comparative measurement with a superconductor as a reference material. This method causes a measurable temperature region to be restricted to a temperature which is lower than the superconducting transition temperature, so that it is necessary to derive the absolute thermoelectric power using the Kelvin relations from the measurable Thomson coefficient to expand the measurement temperature region.

Here, thermoelectric power S is generally defined as $S=\Delta V/\Delta T$ using a voltage $\Delta V$ which is produced when a temperature difference $\Delta T$ is imparted to a metal or a semiconductor. A measurement value of the thermoelectric power based on this definition more accurately applies to a relative value, or, in other words, a difference in the thermoelectric power, of a metal to be measured and a wiring material (metal), so that a correction which takes into account the thermoelectric power of the wiring material is needed to determine the absolute thermoelectric power of the metal to be measured. More specifically, when the thermoelectric power of the metal to be measured is around several tens of μV/K, an effect of such a correction cannot be neglected.

On the other hand, the above-described Thomson coefficient μ is known to be shown with the following Equation (1):

[Equation 1]

$$\mu = \frac{4\kappa a \delta T}{(T_2 - T_1)Il} \quad (1)$$

In the above equation, $T_1$ and $T_2$ are temperatures in units of K at both ends of the metal to be measured when a voltage is applied to the both ends thereof; I is a current in units of A, flowing through the metal; l in the denominator is a length in units of m from an end to a midpoint of the metal; κ is thermal conductivity in units of W/mK of the metal; a is a cross-sectional area in units of m² of the metal; and δT represents a half of a temperature change in units of K at the midpoint of the metal when a polarity-reversed DC voltage is applied to the metal to be measured. The same applies below.

Then, the absolute thermoelectric power S is calculated with the Kelvin equation, or Equation (2) below:

[Equation 2]

$$S = S(T_0) + \int_{T_0}^{T} \frac{\mu(T)}{T} dT \quad (2)$$

In the above Equation, $T_0$ is the superconducting transition temperature.

Here, from Equation (2), it is seen that the Thomson coefficient μ that is accurate is required to determine the absolute thermoelectric power S that is highly precise.

Thus, hereinbelow, a thermophysical property measurement method and a thermophysical property measurement apparatus for obtaining the Thomson coefficient μ that is highly precise through measurement are explained in detail.

FIG. 1 is a block diagram showing the configuration of a thermophysical property measurement device 50 according to an embodiment of the present invention. As shown in FIG. 1, the thermophysical property measurement device 50 includes a user interface 51; a storage device 53; an operation device 54; a measurement device 55; and a bus 52 which connects therebetween.

Here, the user interface 51 has functions of accepting operation instructions of a user for the thermophysical property measurement device 50 and displaying generated data for the user to be able to recognize by visual inspection. Moreover, the storage device 53 stores programs to be executed by the operation device 54 and also stores data supplied via the bus 52. Moreover, the operation device 54 performs a predetermined operation on the supplied data by executing the programs stored in advance in the storage device 53 and calculates the below-described Thomson coefficient and absolute thermoelectric power and thermal conductivity. Then, the measurement device 55 measures the thermoelectric properties included in the thin metal wire (below called "a metal sample"), etc.

Figure 2:
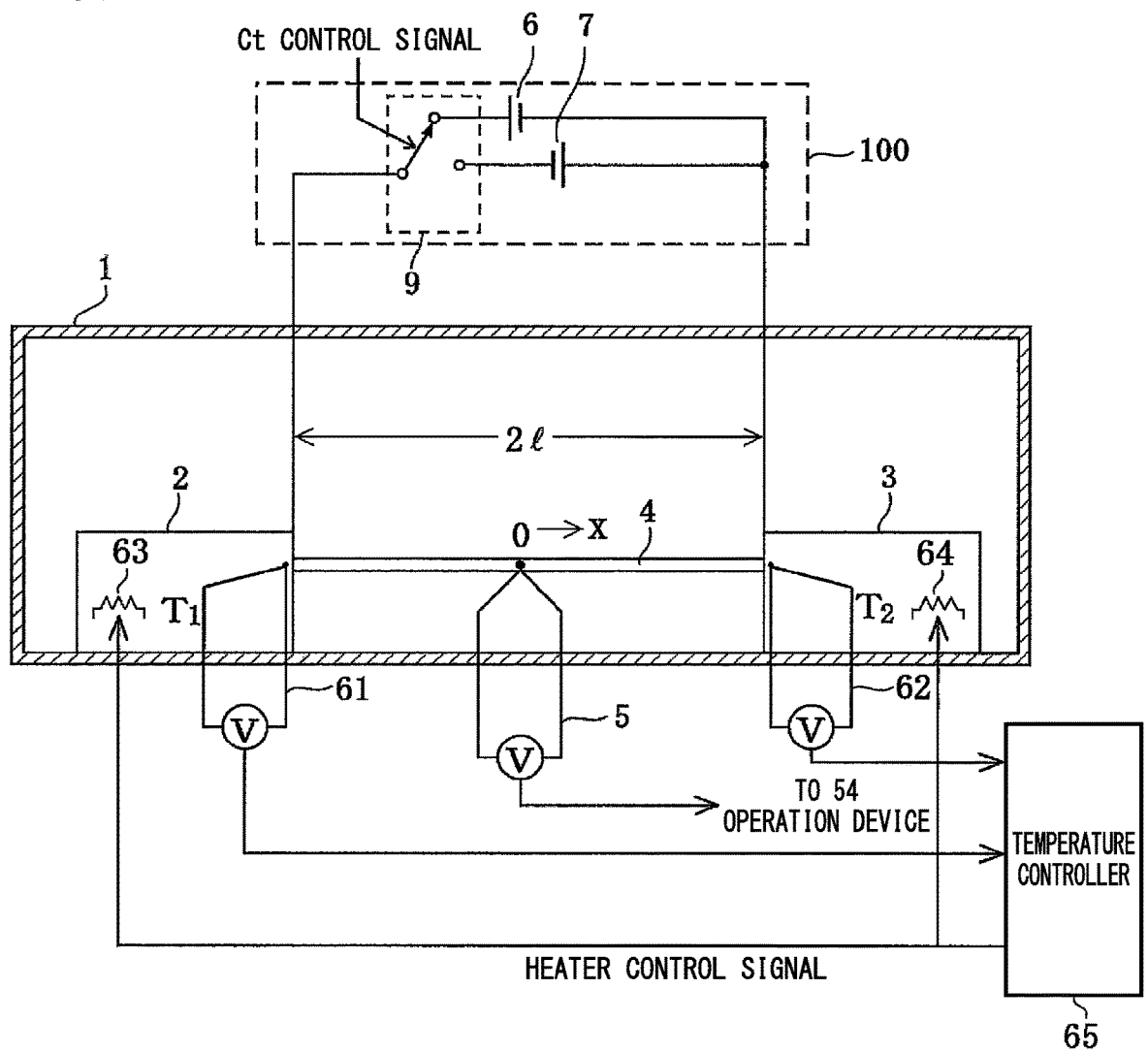
FIG. 2 is a diagram illustrating the configuration of a measurement device 55 shown in FIG. 1.

FIG. 2 is a diagram showing the configuration of the measurement device 55 shown in FIG. 1. As shown in FIG. 2, the measurement device 55 includes a chamber 1; metal blocks 2, 3; thermocouples 5, 61, and 62; heaters for heating 63, 64; a temperature controller 65; and a voltage application device 100. The voltage application device 100 includes a positive-polarity DC power supply 6; a negative-polarity DC power supply 7; and a switch 9.

Moreover, as shown in FIG. 2, the measurement point of the thermocouple 61 for measuring the temperature of the metal block 2 and the thermocouple 62 for measuring the temperature of the metal block 3 are respectively arranged at portions at which a metal sample 4 and the metal blocks 2 and 3 are connected. Then, the temperature controller 65 supplies a heater control signal in accordance with the temperature measured in the thermocouples 61 and 62 to control the heaters for heating 63 and 64 to supply the heat amount such that the temperature of the metal block 2 and the temperature of the metal block 3 are respectively brought to temperatures $T_1$ and $T_2$.

Then, the metal sample 4, for example, is installed in the measurement device 55, which has the configuration as described above, as a subject to be measured.

Here, the measurement device 55 is designed such as to be able to sufficiently satisfy thermal boundary conditions in thermal analysis. More specifically, the interior of the chamber 1 is made to be a vacuum to suppress heat convection, while the metal blocks 2 and 3 of temperatures $T_1$ and $T_2$ are connected to the metal sample 4 to provide a temperature gradient thereto as described above at each end of the metal sample 4. These metal blocks 2 and 3 have the function of a heat bath and the temperature is monitored with the thermocouples 61 and 62 while using a Peltier element, etc., making it possible to realize a precise temperature control.

It is possible to use a tubular furnace which makes ambience control possible as well as to use a stable heater as a method of providing the temperature gradient to the metal sample 4.

Moreover, at the center (origin 0) of the metal sample 4, the thermocouple 5 is mounted to measure the heat absorption and the heat generation that are caused by the Thomson effect. Here, to reduce outflow of heat from the thermocouple 5, a thermocouple whose thermal conductance is sufficiently small is mounted and an output voltage from the thermocouple 5 is measured by a DC voltmeter. The temperature may possibly be measured by using a radiation thermometer in a region of high temperature.

Moreover, between both ends of the metal sample 4, a DC voltage generator 100 which makes it possible to generate DC voltages of different polarities is connected.

Moreover, in accordance with a control signal Ct, the switch 9 selectively connects one of the positive-polarity DC power supply 6 and the negative-polarity DC power supply 7 to both ends of the metal sample 4.

Figure 3:
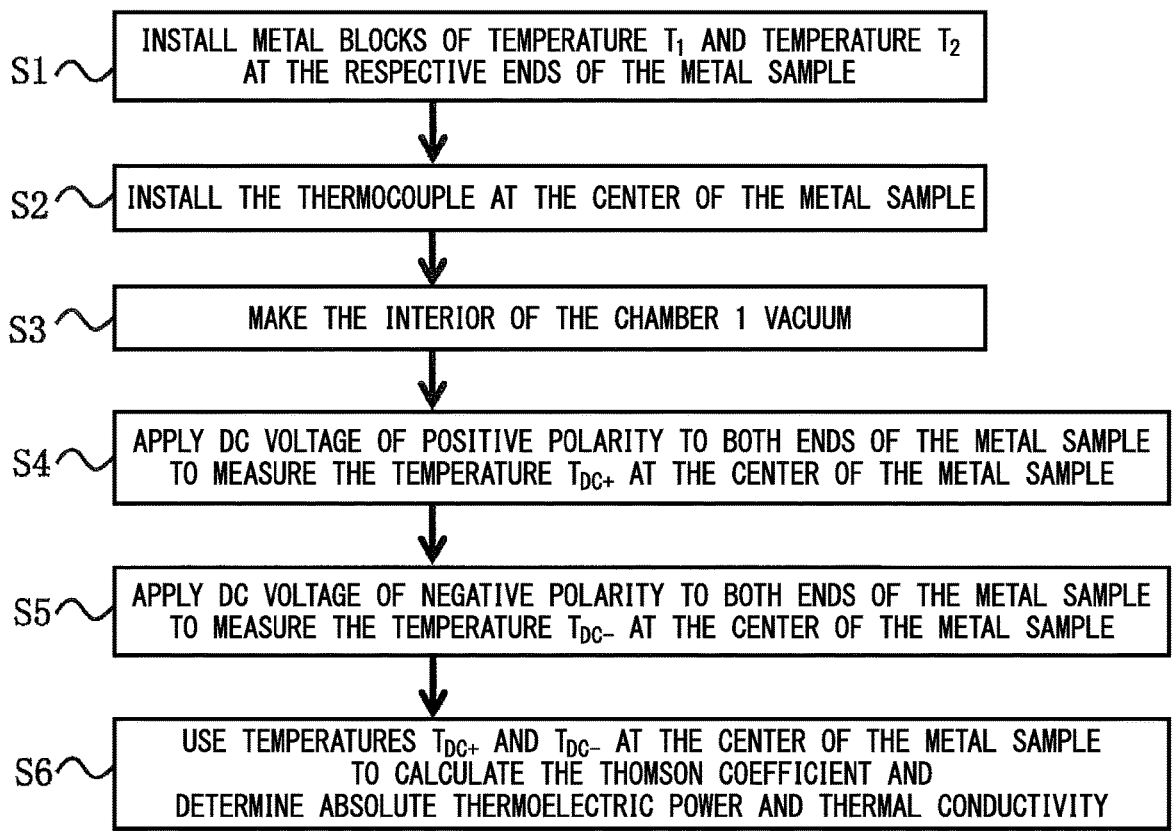
FIG. 3 is a flowchart illustrating a thermophysical property measurement method according to an embodiment of the present invention.

FIG. 3 is a flowchart illustrating a thermoelectric power measurement method according to the present embodiment. Below the thermoelectric power measurement method is explained in detail using FIG. 3.

First, in step S1, the metal block 2 of temperature $T_1$ and the metal block 3 of temperature $T_2$ are installed on the respective ends of the metal sample 4. More specifically, the metal blocks 2 and 3 are arranged on the respective ends of the metal sample 4 and, as described above, the metal blocks 2 and 3 are respectively brought to temperatures $T_1$ and $T_2$ using the temperature controller 65. The temperature control of the metal blocks 2 and 3 by the temperature controller 65 may be performed at any timing as long as it is before the process begins the below-described step S4.

Next, in step S2, the thermocouple 5 is installed at the origin of the metal sample 4 and, in step S3, the interior of the chamber 1 is made vacuum. Next, in step S4, a DC voltage $V_{+DC}$ of positive polarity is applied to both ends of the metal sample 4 to measure the temperature $T_{DC+}$ at the origin of the metal sample 4 with the thermocouple 5. Next, in step S5, a negative-polarity DC voltage $V_{-DC}$ is applied to both ends of the metal sample 4 to measure the temperature $T_{DC-}$ at the origin of the metal sample 4 with the thermocouple 5.

It goes without saying that applying the DC voltages $V_{+DC}$ and $V_{-DC}$ at both ends of the metal sample 4 in steps S4 and S5 represents applying a DC current at both ends of the metal sample 4.

Then, in step S6, a Thomson coefficient is calculated using the temperatures $T_{DC+}$ and $T_{DC-}$ at the origin of the metal sample 4 and the calculated Thomson coefficient is used to determine an absolute thermoelectric power S of the metal sample 4 in accordance with Equation (2). Below, calculation of the Thomson coefficient in the present step is described in detail.

As shown in FIG. 2, a temperature difference is imparted between the respective ends of the metal sample 4 and, at the same time, a DC current is passed through to the metal sample 4. Then, the heat loss flow generated is to flow, via the metal sample 4, and the thermocouple 5 that is installed at the origin thereof, to a hot bath (not shown) of constant temperature (room temperature in this case) that is connected to the thermocouple 5.

Here, when a DC current I is passed through to the metal sample 4 that meets thermal boundary conditions, the heat transfer equation in the steady state of the metal sample 4 may be expressed as Equation (3):

[Equation 3]

$$a\kappa \frac{d^2 T}{dx^2} - \mu I \frac{dT}{dx} + \frac{I^2 \rho}{a} - p\sigma\varepsilon(T^4 - T_0^4) = 0 \qquad (3)$$

In Equation (3), x is a position coordinate in units of m with the midpoint in the metal sample 4 as the origin; T is the temperature in units of K at the position x; $\mu$ is the Thomson coefficient of the metal sample 4 in units of $\mu V/K$; $\rho$ is the electrical resistivity of the metal sample 4 in units of $\Omega/m$; p is the circumferential length of the metal sample 4 in units of m; $\sigma$ is the Stephan-Boltzmann constant in units of $W/m^2 K^4$; $\varepsilon$ is the emissivity; $T_0$ is the zero-point temperature of the thermocouple in units of K; and the same applies below.

Then, in Equation (3), the first term on the left-hand side corresponds to heat conduction in the metal sample 4, the second term on the left-hand side corresponds to heat dissipation and heat absorption due to the Thomson effect, the third term on the left-hand side corresponds to the Joule heat generation, the fourth term on the left-hand side corresponds to radiant heat, and the right-hand side reaches zero since analysis in the steady state is conducted.

Dividing both sides by $a\kappa$ yields Equation (4):

[Equation 4]

$$\frac{d^2 T}{dx^2} - \frac{\mu I}{a\kappa} \frac{dT}{dx} + \frac{I^2 \rho}{a^2 \kappa} - \frac{p\sigma\varepsilon}{a\kappa}(T^4 - T_0^4) = 0 \qquad (4)$$

Heat loss caused by radiation in the fourth term on the left-hand side of Equation (4) may be neglected as it is not more than 1/100 of the Joule heat in the measurement temperature region. Here, the temperature distribution of the metal sample 4 is to be determined by heat conduction via solid, and boundary conditions do not take into account loss due to heat convection, assuming measurement in the vacuum. Moreover, the temperature distribution in the metal sample 4 is to be sufficiently small and physical property values such as the Thomson coefficient, the electrical conductivity, and the thermal conductivity are to be handled as constants. Under these assumptions, Equation (4) may be simplified as Equation (5) as follows:

[Equation 5]

$$\frac{d^2 T}{dx^2} + C\frac{dT}{dx} + D = 0 \qquad (5)$$

In Equation (5), C is a coefficient related to the Thomson term and D is a coefficient related to the Joule term, and the same applies below.

Here, the coefficient C that is caused by the Thomson effect and the coefficient D that is caused by the Joule heat generation are defined as Equation (6) as follows:

[Equation 6]

$$C = -\frac{\mu I}{a\kappa}, \quad D = \frac{I^2 \rho}{a^2 \kappa} \quad (6)$$

With reference to FIG. 2, the boundary conditions are given by Equations (7) and (8) as follows:

[Equation 7]

$$T(-\ell) = T_1, \quad T(\ell) = T_2 \quad (7)$$

[Equation 8]

$$\left.\frac{\partial T}{\partial x}\right|_{x=0-} - \left.\frac{\partial T}{\partial x}\right|_{x=0+} = -\frac{K_1}{a\kappa}(T(0) - T_0) \quad (8)$$

In Equation (8), $K_1$ is the thermal conductance of the thermocouple 5, and the same applies below.

The boundary conditions shown in Equation (8) represent the heat loss from the thermocouple 5 that is mounted at the origin of the metal sample 4. Here, when the terms of second degree or higher for the position x are neglected to expand the series, the temperature $T_{DC}$ in units of K at the midpoint (origin) of the metal sample 4 at the time the DC voltage is applied thereto may be obtained.

[Equation 9]

$$T_{DC} = \frac{Dl^2}{2N}\left(1 - \frac{C^2 l^2}{2}\right) + \frac{T_1 + T_2}{2N} - \frac{Cl}{4N}(T_1 - T_2) \quad (9)$$

Assuming that the thermal conductance of the metal sample 4 is $K_0$ (the same applies below), N in Equation (9) becomes $(1+K_1/K_0)$, representing the coefficient of the heat loss via the thermocouple 5 of the metal sample 4 (the same applies below).

In Equation (9), the first term represents a temperature rise caused by the Joule heat generation and the second order Thomson effect, the second term corresponds to the initial temperature at the origin of the metal sample 4, and the third term represents a temperature change caused by the first order Thomson effect.

As shown in Equation (9), heat absorption and heat generation that are caused by the first order Thomson effect depends on the polarity of the DC voltage that is applied to the metal sample 4, whereas heat generation that is caused by the Joule effect and the second order Thomson effect does not depend thereon. Then, setting the temperature distribution when the positive-polarity DC power supply 6 is connected to both ends of the metal sample 4 to pass the DC current through the metal sample 4 in the positive direction of the position coordinate as $T_{DC+}$ and setting the temperature distribution when the negative-polarity DC power supply 7 is connected to both ends of the metal sample 4 to pass the DC current through the metal sample 4 in the negative direction of the position coordinate as $T_{DC-}$ (and the same applies below), the below-described Equations (10) and (11) may be obtained from Equation (9)

[Equation 10]

$$T_{DC+} = \frac{Dl^2}{2N}\left(1 - \frac{C^2 l^2}{2}\right) + \frac{T_1 + T_2}{2N} - \frac{Cl}{4N}(T_1 - T_2) \quad (10)$$

[Equation 11]

$$T_{DC-} = \frac{Dl^2}{2N}\left(1 - \frac{C^2 l^2}{2}\right) + \frac{T_1 + T_2}{2N} - \frac{Cl}{4N}(T_1 - T_2) \quad (11)$$

Here, the average difference $\delta T_{DC-}$ and the average value $\delta T_{DC+}$ of temperatures at the origin of the metal sample 4 are defined as the following Equations (12) and (13).

[Equation 12]

$$\delta T_{DC-} = \frac{T_{DC+} - T_{DC-}}{2} \quad (12)$$

[Equation 13]

$$\delta T_{DC+} = \frac{T_{DC+} + T_{DC-}}{2} \quad (13)$$

Substituting Equations (10) and (11) into Equation (12), the average difference $\delta T_{DC-}$ is shown in the below-described Equation (14). Here, the average difference $\delta T_{DC-}$ may be shown as the first order Thomson effect term since the Joule heat generation term and the second order Thomson effect terms are canceled out.

[Equation 14]

$$\delta T_{DC-} = -\frac{Cl}{4N}(T_1 - T_2) \quad (14)$$

On the other hand, when Equations (10) and (11) are substituted into Equation (13), the average value $\delta T_{DC+}$ may be shown as the Joule heat generation term and the second order Thomson effect term since the first order Thomson effects are canceled out. Here, in the metal, the product of C and 1 takes a small value and $C^2 l^2$, which is the second order Thomson effect term, may be ignored, so that the average value $\delta T_{DC+}$ may be approximated as the following Equation (15).

[Equation 15]

$$\delta T_{DC+} = \frac{Dl^2}{2N}\left(1 - \frac{C^2 l^2}{2}\right) \cong \frac{Dl^2}{2N} \quad (Cl \ll 1) \quad (15)$$

Moreover, Equation (14) may be transformed as the following Equation (16) using physical quantities such as the temperature difference between both ends of the metal sample 4, current, electrical resistance, the Thomson coefficient, and the Joule heat generation term.

[Equation 16]

$$\delta T_{DC-} = -\frac{Cl}{4N}(T_1 - T_2) = \frac{\frac{Dl^2}{2N} \cdot \mu}{R \cdot I}(T_1 - T_2) \quad (16)$$

In Equation (16), R represents the electrical resistance in units of Ω of the metal sample 4, and the same applies below.

Then, substituting Equation (15) into Equation (16) to solve for the Thomson coefficient μ, the following Equation (17) is obtained.

[Equation 17]

$$\mu = \frac{IR}{(T_1 - T_2)} \frac{\delta T_{DC-}}{\delta T_{DC+}} \quad (17)$$

Equation (17) includes the average difference $\delta T_{DC-}$ and average value $\delta T_{DC+}$, while not including the thermal conductivity, the dimensions, and the heat loss coefficient of the metal sample 4 as variables. Below, calculation of the Thomson coefficient and the absolute thermoelectric power using Equation (17) will be explained in detail with reference to FIG. 4.

Figure 4:
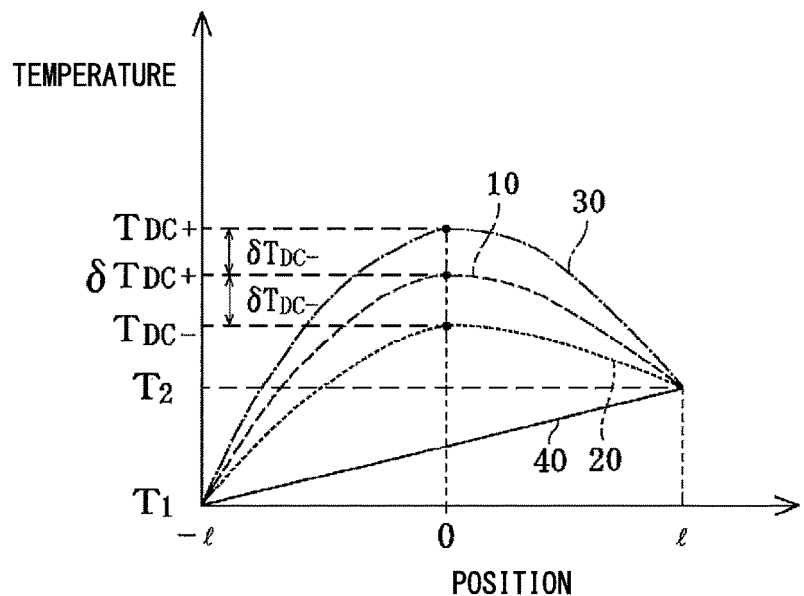
FIG. 4 is a graph illustrating the temperature distribution of a metal sample 4 when a DC voltage is applied to both ends thereof.

FIG. 4 is a graph showing the temperature distribution of the metal sample 4 when the DC voltage is applied to both ends of the metal sample 4. Here, the horizontal axis shows the position coordinate with the midpoint of the metal sample 4 as the origin, while the vertical axis shows the temperature of the metal sample 4. As described above, the metal block 2 of the temperature $T_1$ is placed at one end of the metal sample of length 21 and the metal block 3 of the temperature $T_2$ is placed at the other end of the metal sample of length 21, so that, as shown in a graph 40, the metal sample 4 has a temperature gradient which is in a fixed proportional relationship with the distance from one end between the temperatures $T_1$ and $T_2$ in the initial state. Thus, it is seen that the initial temperature $T_S$ at the origin of the metal sample 4 takes $(T_1+T_2)/2$.

Then, as described above, the temperature distribution of the metal sample 4 when the positive-polarity DC voltage $V_{+DC}$ is applied to both ends of the metal sample 4 in step S4 is shown in a graph 30, while the temperature distribution of the metal sample 4 when the negative-polarity DC voltage $V_{-DC}$ is applied to both ends of the metal sample 4 in step S5 is shown in a graph 20.

Then, by passing the polarity-reversed current as described above, an effect of the Joule heat generated by the current is cancelled out, so that the temperature distribution of the metal sample 4 when there is no such effect as described above is shown with a graph 10, which is positioned between the graph 20 and the graph 30.

Thus, when the DC voltage is applied to the metal sample 4, the temperature at the origin when the effect caused by the current is filtered out may be evaluated as $(T_{DC+}+T_{DC-})/2$, or, in other words, as the above-mentioned average value $\delta T_{DC+}$. Here, the operation device 54 shown in FIG. 1 computes ½ of the difference between the temperature $T_{DC+}$ and the temperature $T_{DC-}$ to calculate the average difference $\delta T_{DC-}$.

Then, in step S6, the operation device 54 executes programs stored in advance in the storage device 53 to calculate the Thomson coefficient μ, by Equation (17) using the obtained temperatures $T_{DC+}$ and $T_{DC-}$ and calculate the absolute thermoelectric power S of the metal sample 4 by Equation (2) using the calculated Thomson coefficient μ. Here, the operation device 54 may also calculate the thermal conductivity in κ accordance with the following Equation (18) using the calculated Thomson coefficient μ.

[Equation 18]

$$\kappa = \frac{I\ell(T_2 - T_1)}{4a\delta T_{DC-}}\mu \quad (18)$$

The values of the absolute thermoelectric power and the thermal conductivity that are calculated as described above are stored in the storage device 53 and the user interface 51 displays such values for the user of the thermophysical measurement device 50 to be able to recognize by visual inspection in accordance with predetermined operations instructions input by the user.

As described above, a thermoelectric measurement method and a thermoelectric measurement apparatus according to embodiments of the present invention may measure the magnitude of DC current that flows through the metal sample 4 and the electrical resistance and control the polarities of the DC voltage and the DC current that are applied at both ends of the metal sample 4 to measure the temperature of the metal sample 4 to calculate the Thomson coefficient, making it possible to easily and conveniently obtain values of the absolute thermoelectric power and the thermal conductivity.

Moreover, the thermophysical property measurement method and thermophysical property measurement apparatus according to the embodiment of the present invention do not require measurement of the thermal conductivity, the dimensions, and the heat loss coefficient of the metal sample 4, which highly precise measurement is generally said to be difficult in calculating the Thomson coefficient, and do not require taking into account the heat loss due to electromagnetic radiation to the measurement space in accordance with the AC frequency caused by using AC power supply, making it possible to obtain highly precise Thomson coefficient, absolute thermoelectric power and thermal conductivity.

EXPLANATIONS OF REFERENCE 2, 3 Metal blocks
4 Thin metal wire (Metal sample)
5, 61, 62 Thermocouples
6 Positive-polarity DC power supply
7 Negative-polarity DC power supply
9 Switch
50 Thermophysical property measurement device
54 Operation device
55 Measurement device
63, 64 Heaters for heating
65 Temperature controller
100 DC voltage generator

The invention claimed is:

1. A thermophysical property measurement method, comprising:
   a first step of applying a DC voltage or a DC current at both ends of a metal to which a temperature gradient is applied to measure a first temperature at a center of the metal;
   a second step of applying DC voltages or DC currents of different polarities at both ends of the metal to measure a second temperature at the center of the metal;
   a third step of calculating an average value of a difference between the first temperature and the second temperature;
   a fourth step of calculating an average value of a sum of the first temperature and the second temperature;
   a fifth step of calculating a Thomson coefficient of the metal by dividing a product of a magnitude of a current that flows through the metal, electrical resistance of the metal, and the average value of the difference by the average value of the sum and the difference between temperatures at the both ends of the metal; and
   a sixth step of calculating at least one of absolute thermoelectric power and thermal conductivity of the metal using the Thomson coefficient calculated in the fifth step.

2. A thermophysical property measurement apparatus, comprising:
   a voltage application unit that applies a DC voltage at both ends of a metal to which a temperature gradient is applied;
   a temperature measurement unit that measures a first temperature at a center of the metal when the DC voltage is applied by the voltage application unit and measures a second temperature at the center of the metal when DC voltages of different polarities are applied by the voltage application unit; and
   a thermophysical property calculation unit that,
      calculates an average value of a difference between the first temperature and the second temperature,
      calculates an average value of a sum of the first temperature and the second temperature,
      calculates a Thomson coefficient of the metal by dividing a product of a magnitude of a current that flows through the metal, electrical resistance of the metal, and the average value of the difference by the average value of the sum and the difference between temperatures at the both ends of the metal, and
      calculates at least one of absolute thermoelectric power and thermal conductivity of the metal using the Thomson coefficient calculated.

3. The thermophysical property measurement apparatus as claimed in claim 2, the voltage application unit further comprising:
   a first DC power supply that applies the DC voltage of positive polarity to the metal;
   a second DC power supply that applies the DC voltage of negative polarity to the metal; and
   a switching unit that selectively connects one of the first DC power supply and the second DC power supply to the both ends of the metal.

4. The thermophysical property measurement apparatus as claimed in claim 2, the thermophysical property measurement apparatus further comprising:
   two metal blocks that are connected to the both ends of the metal; and
   a temperature setting unit that sets the two metal blocks to different temperatures.

5. The thermophysical property measurement apparatus as claimed in claim 4, the thermophysical property measurement apparatus further comprising:
   a thermocouple that measures a temperature of the metal blocks at parts of the metal blocks that are connected to the metal, wherein
      the temperature setting unit sets the temperature of the metal blocks in accordance with the temperature measured by the thermocouple.

* * * * *